(12) United States Patent
Baker, Jr. et al.

(10) Patent No.: US 12,431,026 B2
(45) Date of Patent: Sep. 30, 2025

(54) SYSTEMS AND METHODS FOR BULK AIRCRAFT DATA SIMULATOR AND COMPARISON TOOL

(71) Applicant: The MITRE Corporation, McLean, VA (US)

(72) Inventors: David E. Baker, Jr., Westford, MA (US); John A. Maurer, Burlington, MA (US)

(73) Assignee: The MITRE Corporation, McLean, VA (US)

( * ) Notice: Subject to any disclaimer, the term of this patent is extended or adjusted under 35 U.S.C. 154(b) by 1129 days.

(21) Appl. No.: 17/335,949

(22) Filed: Jun. 1, 2021

(65) Prior Publication Data

US 2022/0383758 A1 Dec. 1, 2022

(51) Int. Cl.
*G08G 5/30* (2025.01)
*G06F 30/20* (2020.01)
(Continued)

(52) U.S. Cl.
CPC ............... *G08G 5/30* (2025.01); *G06F 30/20* (2020.01); *G08G 5/20* (2025.01); *G09B 9/24* (2013.01)

(58) Field of Classification Search
CPC .... G08G 5/003; G08G 5/0017; G08G 5/0021; G08G 5/0039; G08G 5/0052; G06F 30/15; G06F 30/20; G09B 9/08; G09B 9/24

See application file for complete search history.

(56) References Cited

U.S. PATENT DOCUMENTS 6,564,149 B2    5/2003    Lai
8,437,957 B2 *   5/2013    Coulmeau ............ G08G 5/0034
                                                                          701/122

(Continued)

FOREIGN PATENT DOCUMENTS

| CN | 109116867 A | 1/2019 |
|---|---|---|
| EP | 2555179 A2 | 2/2013 |
| KR | 102096376 B1 | 5/2020 |

OTHER PUBLICATIONS

Paglione, M., et al. "A Collaborative Approach to Trajectory Modeling Validation" IEEE 24th Digital Avionics Sys. Conf. (2005) available from <https://ieeexplore.ieee.org/abstract/document/1563350> (Year: 2005).*

(Continued)

*Primary Examiner* — Jay Hann
(74) *Attorney, Agent, or Firm* — Morrison & Foerster LLP

(57) ABSTRACT

Systems and methods for simulating translated aircraft terminal procedures and comparing them to detect for errors in the translation of the terminal procedures. In one or more examples, one or more regulatory agency's routes and procedures for a given airspace are translated into one or more instructions that can be read by a flight computer that is configured to assist a pilot during a flight to adhere to those agency's procedures. A given terminal procedure can have multiple translations associated with it. In order to determine the accuracy of the translation process, in one or more examples, the translations provided by those vendors can be simulated by a computer that is configured to simulate an aircraft's traversal of an airspace using the instructions loaded on to the flight computer. The data generated by the simulations can be used to compare the translations to detect errors in the translation process.

32 Claims, 9 Drawing Sheets

(51) Int. Cl.
  *G08G 5/20*   (2025.01)
  *G09B 9/24*   (2006.01)

(56) References Cited

U.S. PATENT DOCUMENTS

| | | | | |
|---|---|---|---|---|
| 8,554,458 B2* | 10/2013 | Sawhill | ............... | G08G 5/0043 |
| | | | | 701/120 |
| 8,560,148 B2* | 10/2013 | Torres | ................. | G08G 5/0039 |
| | | | | 701/3 |
| 8,818,696 B2* | 8/2014 | Klooster | ............. | G08G 5/0039 |
| | | | | 701/120 |
| 9,250,099 B2* | 2/2016 | Felix | ..................... | G08G 5/025 |
| 9,536,435 B1 | 1/2017 | Shay | | |
| 9,725,157 B2 | 8/2017 | Albert et al. | | |
| 11,302,200 B2* | 4/2022 | Foltan | ................. | G08G 5/0039 |
| 2020/0090524 A1 | 3/2020 | Cherepinsky et al. | | |
| 2023/0195712 A1* | 6/2023 | Carpentier | ............. | G06F 16/23 |
| | | | | 707/609 |

OTHER PUBLICATIONS

Alam, S., et al. "ATOMS: Air Traffic Operations and Management Simulator" IEEE Transactions on Intelligent Transportation Sys., vol. 9, No. 2, pp. 209-225 (2008) (Year: 2008).*

Dupuy et al. "Preliminary Results for a Robust Trajectory Prediction Method Using Advanced Flight Data," 26th Digital Avionics Systems Conference, Oct. 2007; 9 pages.

Liu et al. (Dec. 2018). "Predicting Aircraft Trajectories: A Deep Generative Convolutional Recurrent Neural Networks Approach," 24 pages.

* cited by examiner

| Latitude | Longitude | Altitude[FT] | IAS[Knotts] | Distance[NM] |
|---|---|---|---|---|
| 42.39268168 | -70.99130485 | 1880.799584 | 150 | 1.580826956 |
| 42.43670547 | -70.96299405 | 5363.182373 | 220 | 4.532891844 |
| 42.46404726 | -70.8545355 | 11410.5108 | 267.0173875 | 9.659297238 |
| 42.50866526 | -70.79297279 | 15947.1588 | 280 | 13.50507758 |
| 42.67799425 | -70.64713752 | 30173.33139 | 280 | 25.56480425 |
| 42.799999 | -70.613528 | 39000 | 241.0236803 | 33.04729542 |

FIG. 3

SYSTEMS AND METHODS FOR BULK AIRCRAFT DATA SIMULATOR AND COMPARISON TOOL

STATEMENT REGARDING FEDERALLY SPONSORED RESEARCH OR DEVELOPMENT

This invention was made with Government support under U.S. Government Contract No. DTFAWA-10-C-00080 awarded by the U.S. Department of Transportation Federal Aviation Administration. The Government has certain rights in this invention.

FIELD OF THE DISCLOSURE

This disclosure relates to comparing computer-simulated aircraft trajectories in terminal area procedures, created using a model of a flight management computer that performs operations based on aircraft navigation data.

BACKGROUND OF THE DISCLOSURE

Over the last century, aviation has played a larger and larger role in moving both people and cargo across vast distances. With the rise of aviation as a means to move both people and objects, the number of planes transiting the skies at any given moment in time is massive. In order to accommodate a large number of planes, regulatory agencies have established procedures that planes must follow when navigating the skies to ensure that the volume of planes in a given airspace does not cause collisions between aircraft. For instance, when a plan takes off or lands at a given airport, the pilot may be required to fly specific routes mandated by the regulatory agencies to ensure that aircraft in the airspace maintain the required amount of separation from one another so as to avoid a mid-air collision. In addition to specific routes, the regulatory agencies may also mandate specific procedures to take off or land on a given runaway at a given airport based on the different technologies and systems employed by the aircraft. For instance, a pilot flying a plane with systems allowing it to fly an instrument landing system may have different landing procedures than a pilot who is landing using visual flight rules. Thus, when a pilot lands or takes off from a given airport on a given runway, they must be apprised of the mandated procedures for their take off and landing and navigate the aircraft accordingly.

To negotiate the variety of procedures and flight routes that they must adhere to during a flight, pilots can employ the aid of a flight management computer. A flight management computer can be pre-loaded with the given procedures and routes mandated by the regulatory body, and the pilot can refer to the flight management computer to guide them through a given airspace in a manner that is compliant with the regulatory body's mandated procedures and routes. In one or more examples, the flight management computer can be used in conjunction with a co-pilot system to navigate the plane itself in a manner that adheres to the regulatory body's mandated procedures and routes. While the use of a flight computer can reduce the cognitive burden on a pilot who has to navigate the procedures of a given airspace such as a terminal area (i.e., the airspace around an airport), converting the regulatory body's rules and procedures (which are often published as documents) into instructions for automation systems on the aircraft such as a flight computer can be a complex process. In one or more examples, a human operator is required to take a regulatory body's document outlining the procedures and routes for a given airspace and manually convert that map into a series of instructions that the automation systems can use to navigate the aircraft accordingly. Many organizations and enterprises have taken on the task of translating regulatory body procedures and routes into instructions for flight automation systems. However, this process can be prone to error because it requires a human to properly translate the regulatory body's information into instructions for the flight computer. A human can make mistakes in the translation process, such that the instructions provided by the human translator to the automation system may not fly the aircraft in the manner required by the regulatory body.

In one or more examples, one way to determine if a translation error has occurred is to operate an aircraft using the translated instructions and determine if the flight is navigating the airspace in a manner that complies with the regulatory body's requirements. However, given the myriad of instructions for the many runaways and the many airports globally, manual testing of the instructions to ensure translation accuracy is not feasible.

SUMMARY OF THE DISCLOSURE

According to an aspect of the disclosure, one or more regulatory agency's routes and procedures for a given airspace are translated into one or more instructions that can be read by a flight computer that is configured to assist a pilot during a flight to adhere to those agency's procedures. The translation is often performed by dedicated vendors who specialize in translating the procedures to instructions for a flight computer. In one or more examples, multiple vendors can translate the same procedure or procedures into instructions for a flight computer. Thus, a given flight computer can be loaded with navigation instructions for thousands of airport's and airspace routes, allowing the pilot to simply choose the route they want the aircraft to use during a given flight. In order to determine the accuracy of the translation process, in one or more examples, the translations provided by those vendors can be simulated by a computer that is configured to simulate an aircraft's traversal of an airspace using the instructions loaded on to the flight computer. In one or more examples, the simulation can produce a trajectory file for each simulation that can record the simulated location, airspeed, altitude, and other metrics of a flight at periodic intervals. As an example, a given trajectory file can include information about an aircraft's trajectory every thousand milliseconds.

According to an aspect of the disclosure, after the simulator produces multiple trajectory files for a given route or procedure, those trajectory files can be processed using a comparison procedure so that they can be compared with one another to determine if one or more of those files include errors in the translation process. In one or more examples, two trajectory files of the same procedure can be converted into a first vector and a second vector respectively. The first vector can represent the trajectory file associated with a first translation of the procedure and the second vector can represent the trajectory file associated with a second translation of the same procedure. In one or more examples, for each point in the first vector, the closest point in the second vector can be determined. In one or more examples, the process can then determine which points in second vector did not match to any of the points in the first vector. In one or more examples, the non-matched points from the second vector can be analyzed to determine the closest point in first vector to the unmatched point. After all of the matches (i.e., closest points have been determined for each and every point for both the first vector and second vector) have been determined, the process can then compare each point and generate comparison metrics for the two vectors that provides information as to how closely the first vector and second vector matched one another. In one or more examples, if the comparison metrics exceed a pre-determined threshold, then it can be determined that there is an error in the translation process for at least one of the flight instructions used to generate a trajectory file and the instructions used to generate those trajectory files can be flagged for further analysis.

According to an aspect of the disclosure, a method for comparing flight management computer instructions for an airspace procedure includes: receiving a first translation of the airspace procedure, wherein the first translation comprises a first set of instructions for a flight management computer based on the airspace procedure, receiving a second translation of the airspace procedure, wherein the second translation comprises a second set of instructions for a flight management computer based on the airspace procedure, simulating the first translation on a computer-based simulator configured to simulate a response of an aircraft operating with a flight management computer operating on the first set of instructions of the first translation, wherein simulating the first translation comprises generating a first trajectory file, and wherein the first trajectory file includes a plurality of data points associated with one or more attributes of the simulated response, simulating the second translation on the computer-based simulator configured to simulate a response of an aircraft operating with a flight management computer operating on the second set of instructions of the second translation, wherein simulating the second translation comprises generating a second trajectory file, and wherein the second trajectory file includes a plurality of data points associated with one or more attributes of the simulated response, for each data point of the plurality of data points of the first trajectory file, determining a matching data point from the plurality of data points of the second trajectory file, determining which data points of the plurality of data points of the second trajectory file were not determined to be a matching data point with a data point of the plurality of data points of the first trajectory file, for each data point of the plurality of data points of the second trajectory file not determined to be a matching data point with a data point of the plurality of data points of the first trajectory file, determining a matching data point from the plurality of data points of the first trajectory file, and for each matched data point of the first and second trajectory files, generating one or more comparison metrics, wherein generating one or more comparison metrics comprises comparing the one or more attributes associated with the matched data points from the first and second trajectory files.

Optionally, the airspace procedure comprises a terminal area procedure for navigating an aircraft in an airspace associated with a runway of an airport.

Optionally, the first and second translations convert the airspace procedure into a Digital Aeronautical Flight Information File (DAFIF).

Optionally, the first and second translations convert the airspace procedure into an ARINC 424 file.

Optionally, the one or more attributes associated with the first and second trajectory files include latitude, longitude, air speed, altitude, and ground track distance.

Optionally, determining a matching data point from the plurality of data points of the second trajectory file comprises: for each data point of the second trajectory file, determining a distance between the data point of the first trajectory and the data point of the second trajectory file, and selecting the data point from the second trajectory file that has the shortest distance from the data point of the first trajectory.

Optionally, determining a distance between the data point of the first trajectory and the data point of the second trajectory file comprises measuring a Cartesian distance between the data point of the first trajectory and the data point of the second trajectory file.

Optionally, determining a matching data point from each data point of the plurality of data points of the second trajectory file not determined to be a matching data point with a data point of the plurality of data points of the first trajectory file from the plurality of data points of the second trajectory file comprises: for each data point of the first trajectory file, determining a distance between the data point of the second trajectory file and the data point of the first trajectory file, and selecting the data point from the second trajectory file that has the shortest distance from the data point of the first trajectory.

Optionally, the method comprises: comparing the generated one or more comparison metrics with one or more pre-determined thresholds, and determining if one or both of the first translation and the second translation contain one or more errors based on the comparison between the one or more comparison metrics with the one or more pre-determined thresholds.

Optionally, the one or more comparison metrics are generated based on comparing the latitude, longitude, air speed, altitude, and ground track distance of data points being compared.

According to an aspect of the disclosure, a system for comparing flight management computer instructions for an airspace procedure, comprises: a memory, one or more processors, wherein the memory stores one or more programs that when executed by the one or more processors, cause the one or more processors to: receive a first translation of the airspace procedure, wherein the first translation comprises a first set of instructions for a flight management computer based on the airspace procedure, receive a second translation of the airspace procedure, wherein the second translation comprises a second set of instructions for a flight management computer based on the airspace procedure, simulate the first translation on a computer-based simulator configured to simulate a response of an aircraft operating with a flight management computer operating on the first set of instructions of the first translation, wherein simulating the first translation comprises generating a first trajectory file, and wherein the first trajectory file includes a plurality of data points associated with one or more attributes of the simulated response, simulate the second translation on the computer-based simulator configured to simulate a response of an aircraft operating with a flight management computer operating on the second set of instructions of the second translation, wherein simulating the second translation comprises generating a second trajectory file, and wherein the second trajectory file includes a plurality of data points associated with one or more attributes of the simulated response, for each data point of the plurality of data points of the first trajectory file, determine a matching data point from the plurality of data points of the second trajectory file, determine which data points of the plurality of data points of the second trajectory file were not determined to be a matching data point with a data point of the plurality of data points of the first trajectory file, for each data point of the plurality of data points of the second trajectory file not determined to be a matching data point with a data point of the plurality of data points of the first trajectory file, determine a matching data point from the plurality of data points of the first trajectory file, and for each matched data point of the first and second trajectory files, generate one or more comparison metrics, wherein generating one or more comparison metrics comprises comparing the one or more attributes associated with the matched data points from the first and second trajectory files.

Optionally, the airspace procedure comprises a terminal area procedure for navigating an aircraft in an airspace associated with a runway of an airport.

Optionally, the first and second translations convert the airspace procedure into a Digital Aeronautical Flight Information File (DAFIF).

Optionally, the first and second translations convert the airspace procedure into an ARINC 424 file.

Optionally, the one or more attributes associated with the first and second trajectory files include latitude, longitude, air speed, altitude, and ground track distance.

Optionally, determining a matching data point from the plurality of data points of the second trajectory file comprises: for each data point of the second trajectory file, determining a distance between the data point of the first trajectory and the data point of the second trajectory file, and selecting the data point from the second trajectory file that has the shortest distance from the data point of the first trajectory.

Optionally, determining a distance between the data point of the first trajectory and the data point of the second trajectory file comprises measuring a Cartesian distance between the data point of the first trajectory and the data point of the second trajectory file.

Optionally, determining a matching data point from each data point of the plurality of data points of the second trajectory file not determined to be a matching data point with a data point of the plurality of data points of the first trajectory file from the plurality of data points of the second trajectory file comprises: for each data point of the first trajectory file, determining a distance between the data point of the second trajectory file and the data point of the first trajectory file, and selecting the data point from the second trajectory file that has the shortest distance from the data point of the first trajectory.

Optionally, the processor is caused to: compare the generated one or more comparison metrics with one or more pre-determined thresholds, and determine if one or both of the first translation and the second translation contain one or more errors based on the comparison between the one or more comparison metrics with the one or more pre-determined thresholds.

Optionally, the one or more comparison metrics are generated based on comparing the latitude, longitude, air speed, altitude, and ground track distance of data points being compared.

According to an aspect of the disclosure, a non-transitory computer readable storage medium storing one or more programs for comparing flight management computer instructions for an airspace procedure, for execution by one or more processors of an electronic device that when executed by the device, cause the device to: receive a first translation of the airspace procedure, wherein the first translation comprises a first set of instructions for a flight management computer based on the airspace procedure, receive a second translation of the airspace procedure, wherein the second translation comprises a second set of instructions for a flight management computer based on the airspace procedure, simulate the first translation on a computer-based simulator configured to simulate a response of an aircraft operating with a flight management computer operating on the first set of instructions of the first translation, wherein simulating the first translation comprises generating a first trajectory file, and wherein the first trajectory file includes a plurality of data points associated with one or more attributes of the simulated response, simulate the second translation on the computer-based simulator configured to simulate a response of an aircraft operating with a flight management computer operating on the second set of instructions of the second translation, wherein simulating the second translation comprises generating a second trajectory file, and wherein the second trajectory file includes a plurality of data points associated with one or more attributes of the simulated response, for each data point of the plurality of data points of the first trajectory file, determine a matching data point from the plurality of data points of the second trajectory file, determine which data points of the plurality of data points of the second trajectory file were not determined to be a matching data point with a data point of the plurality of data points of the first trajectory file, for each data point of the plurality of data points of the second trajectory file not determined to be a matching data point with a data point of the plurality of data points of the first trajectory file, determine a matching data point from the plurality of data points of the first trajectory file, and for each matched data point of the first and second trajectory files, generate one or more comparison metrics, wherein generating one or more comparison metrics comprises comparing the one or more attributes associated with the matched data points from the first and second trajectory files.

Optionally, the airspace procedure comprises a terminal area procedure for navigating an aircraft in an airspace associated with a runway of an airport.

Optionally, the first and second translations convert the airspace procedure into a Digital Aeronautical Flight Information File (DAFIF).

Optionally, the first and second translations convert the airspace procedure into an ARINC 424 file.

Optionally, the one or more attributes associated with the first and second trajectory files include latitude, longitude, air speed, altitude, and ground track distance.

Optionally, determining a matching data point from the plurality of data points of the second trajectory file comprises: for each data point of the second trajectory file, determining a distance between the data point of the first trajectory and the data point of the second trajectory file, and selecting the data point from the second trajectory file that has the shortest distance from the data point of the first trajectory.

Optionally, determining a distance between the data point of the first trajectory and the data point of the second trajectory file comprises measuring a Cartesian distance between the data point of the first trajectory and the data point of the second trajectory file.

Optionally, determining a matching data point from each data point of the plurality of data points of the second trajectory file not determined to be a matching data point with a data point of the plurality of data points of the first trajectory file from the plurality of data points of the second trajectory file comprises: for each data point of the first trajectory file, determining a distance between the data point of the second trajectory file and the data point of the first trajectory file, and selecting the data point from the second trajectory file that has the shortest distance from the data point of the first trajectory.

Optionally, the device is caused to: compare the generated one or more comparison metrics with one or more pre-determined thresholds, and determine if one or both of the first translation and the second translation contain one or more errors based on the comparison between the one or more comparison metrics with the one or more pre-determined thresholds.

Optionally, the one or more comparison metrics are generated based on comparing the latitude, longitude, air speed, altitude, and ground track distance of data points being compared.

It will be appreciated that any of the variations, aspects, features and options described in view of the systems apply equally to the methods and vice versa. It will also be clear that any one or more of the above variations, aspects, features and options can be combined.

BRIEF DESCRIPTION OF THE FIGURES

FIG. 3 illustrates an exemplary trajectory file according to examples of the disclosure.

DETAILED DESCRIPTION OF THE DISCLOSURE

Figure 1:
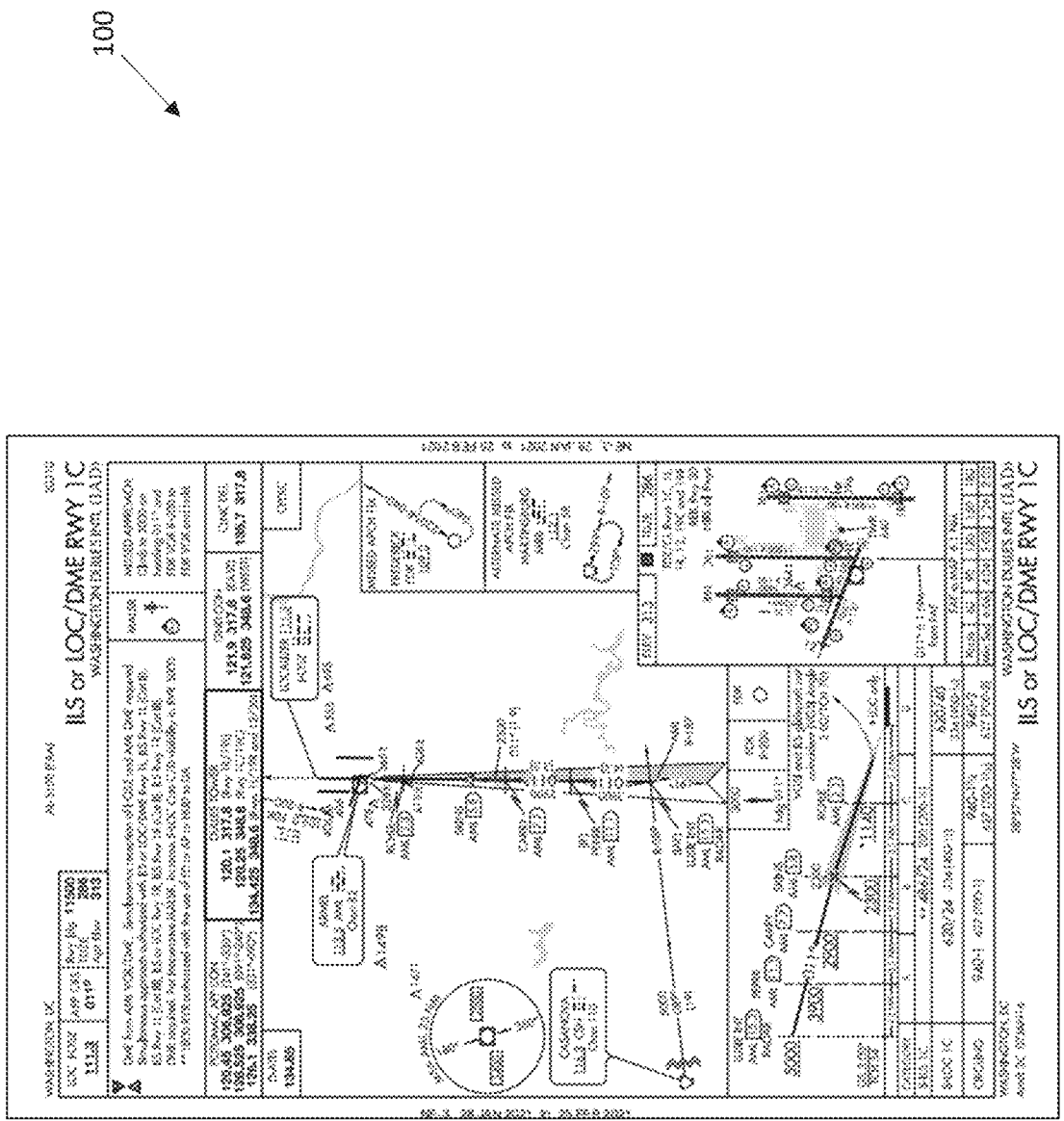
FIG. 1 illustrates an exemplary regulatory agency flight procedure according to examples of the disclosure.

Reference will now be made in detail to implementations and embodiments of various aspects and variations of systems and methods described herein. Although several exemplary variations of the systems and methods are described herein, other variations of the systems and methods may include aspects of the systems and methods described herein combined in any suitable manner having combinations of all or some of the aspects described.

Described herein are systems and methods for comparing aircraft trajectories generated during terminal area procedures using flight simulation data. In one or more examples, a terminal area flight procedure can be converted into one or more instructions for a flight computer that when executed by the flight computer can automate at least a portion of the flight procedures to decrease the cognitive burden of a pilot when operating an aircraft. In one or more examples, the terminal area flight procedure can be translated into flight computer instructions multiple times by various database operators who maintain a database of translations of terminal area procedure into flight computer instructions. As a way of comparing the multiple translations to determine if there are any potential translation errors in the translated instructions, the multiple translations can be simulated on a flight computer simulation system that can simulate an aircraft navigating a terminal area procedure using the instructions.

In one or more examples, each simulation of a translated flight procedure can generate a trajectory file that includes metrics from a simulated flight such as position, speed, altitude, taken at periodic intervals. Each translated flight procedure can be individually simulated thus generating a unique trajectory file for each translation. In order to determine if there is a possible error in one of the translations, trajectory files from the same terminal area procedure can be compared against one another to determine if one or more of those files deviate from the others thereby indicating a possible error during the translation process. In one or more examples, two trajectory files of the same procedure can be converted into a first vector and a second vector respectively. The first vector can represent the trajectory file associated with a first translation of the procedure and the second vector can represent the trajectory file associated with a second translation of the same procedure. In one or more examples, for each point in the first vector, the closest point in the second vector can be determined. In one or more examples, the process can then determine which points in the second vector did not match to any of the points in the first vector. In one or more examples, the non-matched points from the second vector can be analyzed to determine the closest point in the first vector to the unmatched point. After all of the matches (i.e., closest points have been determined for each and every point for both the first vector and second vector) have been determined, the process can then compare each point and generate comparison metrics for the two vectors that provides information as to how closely the first vector and second vector matched one another. In one or more examples, if the comparison metrics exceed a pre-determined threshold, then it can be determined that there is an error in the translation process for at least one of the flight instructions used to generate a trajectory file and the instructions used to generate those trajectory files can be flagged for further analysis.

In the following description of the various embodiments, it is to be understood that the singular forms "a," "an," and "the" used in the following description are intended to include the plural forms as well, unless the context clearly indicates otherwise. It is also to be understood that the term "and/or" as used herein refers to and encompasses any and all possible combinations of one or more of the associated listed items. It is further to be understood that the terms "includes, "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

Certain aspects of the present disclosure include process steps and instructions described herein in the form of an algorithm. It should be noted that the process steps and instructions of the present disclosure could be embodied in software, firmware, or hardware and, when embodied in software, could be downloaded to reside on and be operated from different platforms used by a variety of operating systems. Unless specifically stated otherwise as apparent from the following discussion, it is appreciated that, throughout the description, discussions utilizing terms such as "processing," "computing," "calculating," "determining," "displaying," "generating" or the like, refer to the action and processes of a computer system, or similar electronic computing device, that manipulates and transforms data represented as physical (electronic) quantities within the computer system memories or registers or other such information storage, transmission, or display devices.

The present disclosure in some embodiments also relates to a device for performing the operations herein. This device may be specially constructed for the required purposes, or it may comprise a general purpose computer selectively activated or reconfigured by a computer program stored in the computer. Such a computer program may be stored in a non-transitory, computer readable storage medium, such as, but not limited to, any type of disk, including floppy disks, USB flash drives, external hard drives, optical disks, CD-ROMs, magnetic-optical disks, read-only memories (ROMs), random access memories (RAMs), EPROMS, EEPROMs, magnetic or optical cards, application specific integrated circuits (ASICs), or any type of media suitable for storing electronic instructions, and each connected to a computer system bus. Furthermore, the computing systems referred to in the specification may include a single processor or may be architectures employing multiple processor designs, such as for performing different functions or for increased computing capability. Suitable processors include central processing units (CPUs), graphical processing units (GPUs), field programmable gate arrays (FPGAs), and ASICs.

The methods, devices, and systems described herein are not inherently related to any particular computer or other apparatus. Various general-purpose systems may also be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the present disclosure as described herein.

With air travel becoming the predominant method of moving people and cargo across large distances, air traffic coordination is an issue that touches upon not only the efficient movement of aircraft, but also the safety of air travel. In order to safely and efficiently move aircraft through the skies both efficiently and safely, air traffic can be coordinated so that aircraft flying a given airspace can move in a pre-arranged manner through the airspace. This coordination can be implemented by a regulatory agency such as the United States' Federal Aviation Administration (FAA). In one or more example, a regulatory agency such as the FAA, can set navigation procedures and navigation routes for airplanes to follow when transiting an airspace, so that all of the planes in a given airspace are operating in a coordinated manner thereby minimizing the risk of collisions between aircraft, as well as minimizing the risk of aircraft colliding with the terrain (i.e., mountains) of the given airspace. The risk of collision can be especially prevalent when aircraft transit in and out of airports (also known as terminal areas). Since a given airport may have multiple runways in which planes are simultaneously landing and taking off, aircraft may have to be follow a myriad of procedures and navigation routes to safely transit in and out of terminal areas. To facilitate this type of coordination, regulatory agencies such as the FAA may publish navigation procedures and routes for aircraft to execute when flying in certain areas using specific equipment or flight rules. For instance, an aircraft landing at runway IC at Washington Dulles International Airport (IAD), may have to navigate to the runway in a specific manner, and adjust their altitude at specific waypoints during the flight so as to maintain coordination with other planes flying in the same airspace. The FAA or other regulatory agency may publish a specific terminal area procedure for landing at runway 1C at IAD that aircraft must follow in order to safely land at the runway. That procedure can not only take into account the specific runway, but also the type of landing being performed (i.e., instrument landing system (ILS) or visual).

FIG. 1 illustrates an exemplary regulatory agency flight procedure according to examples of the disclosure. In one or more examples, the procedure 100 depicted in FIG. 1 can represent the flight procedures to be followed by a pilot when performing an ILS approach at runway IC at Washington Dulles International Airport. In one or more examples, the procedure published by the regulatory information can include such information as the navigation waypoints that a flight is supposed to follow when navigating to the runway. In one or more examples, the published information as shown in procedure 100 can include altitude targets for acquiring and maintaining the glide slope of the runway, as well as radio information, localizer information, and other communications information to be used by the pilot during an ILS approach at the runway. In one or more examples, the procedure 100 can include missed approach information that includes the altitude and heading that a pilot should take in the event that the pilot has to abort a landing for any reason.

When a pilot attempts to land at runway IC using ILS rules, they may consult with the published procedure illustrated 100 to ensure that they are navigating the aircraft in compliance with the traffic patterns altitude requirements published by the FAA. However, if the pilot wants to avail themselves of any automatic systems (such as a co-pilot) system that can take control of the plane, then in order to operate the aircraft according to the FAA procedures, those procedures may have to be translated into instructions that can be parsed and executed by a flight management computer so as to control the aircraft in accordance with the published procedures for the airspace that is currently being transited. Using the example of FIG. 1 above, if the pilot wished to engage a co-pilot system to take control of the aircraft and perform the ILS landing procedure at runway 1C at IAD, then the flight computer that will coordinate the co-pilot's actions, must have knowledge of the procedure 100 and have a set of stored instructions that it can use to execute maneuvers in accordance with the procedure 100.

In one or more examples, the procedures mandated by the regulatory agency can be pre-programmed into the flight computer such that a pilot can simply indicate which procedure to initiate on the flight computer, and then the computer can operate the aircraft in accordance with the procedure selected by the pilot. However, pre-programming the flight computer with the procedure requires translating a published procedure meant for human pilot consumption (such as the example of FIG. 1), into a set of instructions that the flight computer can act on. Many companies and other enterprises, as a commercial venture, have undertaken the task of converting FAA procedures into instructions that can be understood by a flight management computer. These companies produce and maintain a database of flight computer instructions that correspond to procedures mandated by a regulatory agency such as the FAA, and sell these translated instructions to aircraft manufactures or flight computer manufacturers so that they may then offer them to their customers (i.e., pilots/airlines).

Translating FAA procedures to flight computer instructions is not a deterministic process. In one or more examples, one flight procedure can be translated in a myriad of different ways. While the translations are different, the net result can be the same, a flight computer that will operate a flight according to an FAA procedure. The process of translating FAA procedures to instructions for a flight computer can be a human led process, in which a human reads the flight procedure, and then proceeds to draft an instruction set that complies with the FAA procedure. Since the translation process, in one or more examples, is performed by humans it may be prone to human error. During the process of translating the regulatory agency's procedures into flight computer instructions, a human translator may make one or more errors, such as a typographical errors or errors in translating the published terminal area procedures. However, determining when such errors have occurred can be difficult. Reading the translation itself may not reveal errors in the transcription process. In one or more examples, one method to determine a translation error is to actually have an aircraft operate a flight according to the translated instructions to determine if the instructions adhere to the published procedure. However, this method is not feasible because of the sheer volume of flight procedures for a given terminal area. With multiple runways and procedures for different equipment scenarios (i.e., instrument v. visual), even running test flights at a single airport to test the translations is a large endeavor, let alone running the flights for every translation of every procedure at every airport across the world. The time and expense make this method of verification infeasible.

Figure 2:
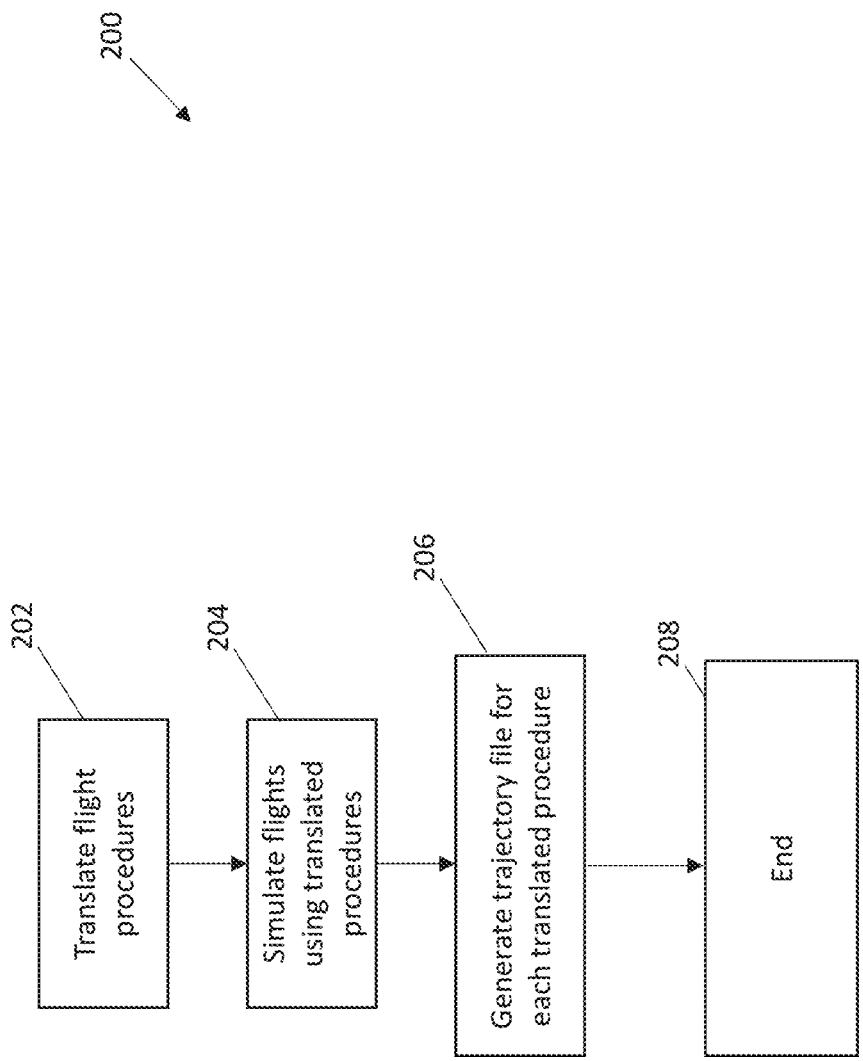
FIG. 2 illustrates an exemplary flight simulation process according to examples of the disclosure.

In one or more examples, a simulator can be used to test the translations of flight procedures. In one or more examples, the simulator can consume operational navigation data and then can use a computer model of a flight management computer to create a trajectory for how an aircraft would fly the navigation data. FIG. 2 illustrates an exemplary flight simulation process according to examples of the disclosure. In one or more examples of the disclosure, the process 200 depicted in FIG. 2 can begin at step 202 wherein a given flight procedure is translated by one or more entities into instructions that can be used by a flight management computer to automate all or a portion of the control of an aircraft flying the procedure. As discussed above, there can be multiple translations of the same procedure each offered by different companies or vendors or multiple translations offered by a single entity. In one or more examples, translations can be made in the form of a Digital Aeronautical Flight Information File (DAFIF) or alternative and/or in addition an ARINC 424 standard file. For each procedure, multiple files can exist, and thus in order to test whether or not there are any translation errors present in the file, they can be inputted into a simulator as discussed below.

In one or more examples, after the translations are created at step 202, the process 200 can move to step 204 wherein the translations are run through a simulator to simulate how a flight running a flight computer with the translated procedures would operate under those translated procedures. In one or more examples, the simulator can be configured to ingest a translation file (for instance in DAFIF or ARINC 424 format) and simulate the trajectory of a flight running the translation. In one or more examples, the simulator can produce a set of values for each point in the simulated flight: elapsed time, latitude, longitude, altitude, indicated air speed, and along track distance. The simulator can be configured to produce a set of values at periodic intervals. For instance, the simulator can be configured to produce a set of values every 10 milliseconds such that the simulator can record the latitude, longitude, altitude, air speed, and track distance of the simulated flight every 10 millisecond for the entire duration of the flight. In one or more examples, these six values can be treated as a state vector for the point.

In one or more examples, once the simulation is run for each procedure at step 204, the process 200 can move to step 206 wherein one or more trajectory files can be generated for each simulation, which as described in detail below can be used to determine if any possible errors have occurred in the translation process. In one or more example, the results of the simulation can be output into several files for analysis, including a track file containing the state of each point of the simulated flight and a "leg report" file containing a summary of the state at the end of each procedure segment. As described in further detail below, the trajectory file or files produced by the simulator can be compared against one another to determine if there is a potential error in the translation process. Once the trajectory files have been generated at step 206, the process 200 can move to step 208 wherein the process is terminated.

FIG. 3 illustrates an exemplary trajectory file according to examples of the disclosure. In one or more examples, the trajectory file 300 can include information about the state of a flight at a given time during the simulation. For instance, in one or more examples, the trajectory file 300 can include multiple rows 302, with each row 302 corresponding to a snapshot of the flight activity at a given time. Each row 302 can correspond to a periodic interval in which the data is recorded. Thus, and as an example, if the simulation is configured to record data at 10 millisecond intervals, then each row 302 of the trajectory file can correspond to a snapshot of the flight's trajectory taken 10 milliseconds after the previous row.

In one or more examples, each row can include various parameters about the flight include the latitude of the flight (as shown at 304), the longitude of the flight (as shown at 306), the altitude of the flight (as shown at 308) the indicated airspeed of the flight (as shown at 310) and the ground track distance (taken from the initial starting point, as shown at 312). Since a flight or a portion of the flight flown during terminal procedures can often take minutes, a trajectory file can, in one or more examples, can include thousands of rows. Thus, simply reviewing a trajectory file to detect errors is not feasible since the amount of data to be analyzed is voluminous and the data by itself may not reveal errors in the transcription process. Thus in one or more examples, in order to detect errors, rather than review a single trajectory file to detect an error, it can be beneficial to instead compare trajectory files generated by translations of the same procedure. In one or more examples, if the comparison shows that the two trajectory files diverge by a significant amount, than this divergence can signify that one of the files in the comparison includes some type of translation error. However, as discussed in detail below, comparing trajectory files manually may not be feasible because each trajectory file includes large amounts of data, and comparing them point-by-point may in and of itself not reveal an error.

In one or more examples, the comparison of flight paths in terminal area procedures can also include several complications that can be driven by weather, aircraft performance (e.g., power of engines, autopilot error), avionics functionality, and navigation database inputs. These differences can drive the requirements to know what path definition, altitude, speed, and along track errors exist. These complications can mean that there is never a fixed starting point at which to compare the simulation results because the initial state of the aircraft can be a function of database inputs, which can be different (e.g., if one database has a different waypoint). Furthermore, there may be no truth source to compare the flights against, since all databases are subject to error before the data is consumed by operational aircraft. In one or more examples, the actual flights can converge/diverge in 4 dimensions (with respect to each other) and the changes may be non-monotonic in how they change. In addition, the flights may not be correlated in time nor are samples taken at the same rate. In short, the aircraft could be flying a different trajectory and we can't assume either the flight plan or the trajectory are similar enough to just start at a location in either.

Figure 4:
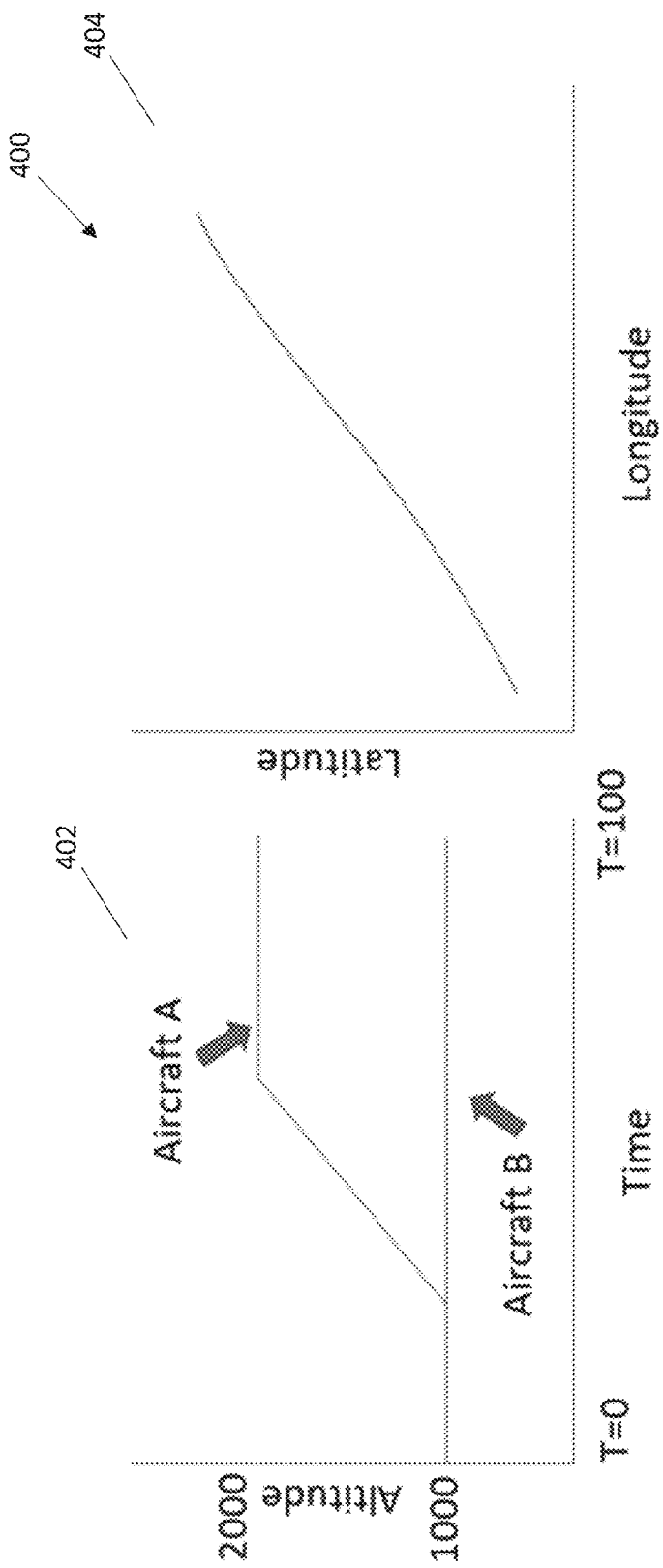
FIG. 4 illustrates an exemplary altitude and ground track graph according to examples of the disclosure.

FIG. 4 illustrates an exemplary altitude and ground track graph according to examples of the disclosure. The example of FIG. 4 can illustrate the challenges associated with comparing two simulation results to determine if there is a significant difference between the two results. In one or more examples, the example graphs 400 of FIG. 4 can illustrate a scenario in which two aircraft may look the same from a cross track error perspective but have significant differences in speed/altitude over the ground track. In one or more examples, two aircraft (labeled A and B in the figure) may differ significantly with respect to their ground tracks. For instance, as shown in chart 402, Aircraft A may increase its altitude mid-flight, while Aircraft B may keep a steady altitude throughout the duration of its flight. Thus, even though the cross-track error shown at graph 404 (i.e., differences in latitude and longitude between the flights) may appear as if there is no noticeable difference between the flights, the ground tracks of both flights may have significant differences because if you just took the distances between the points in the order they appear in the trajectory the points may appear to diverge significantly since Aircraft B will cover more distance than Aircraft A in the same amount of time because Aircraft B is maintaining a steady altitude while Aircraft A increases its altitude mid-flight. Thus, simply comparing the ground tracks of the two flights as reflected in graph 402 may lead one to believe there is significant divergence between the two tracks, however as shown in 404, that difference is minimal from a cross-track perspective.

As demonstrated by the example of FIG. 4, two aircraft flights may converge/diverge with respect to each other in a non-monotonic fashion. For instance, if the corresponding points in time from Aircraft A and Aircraft B are compared, you may get larger divergences between the flights because Aircraft B would be covering more ground vs. time than Aircraft A. However, from a cross track standpoint, the two flight tracks are nearly identical as shown in graph 404. Thus, performing a point-by-point comparison between the trajectory files of Aircraft A and Aircraft B, may lead to a conclusion that there is a potential error in one of the translations because Aircraft A and Aircraft B may look like they diverge significantly from one another, however as graph 404 demonstrates, the two Aircraft may not actually diverge significantly.

Figure 5:
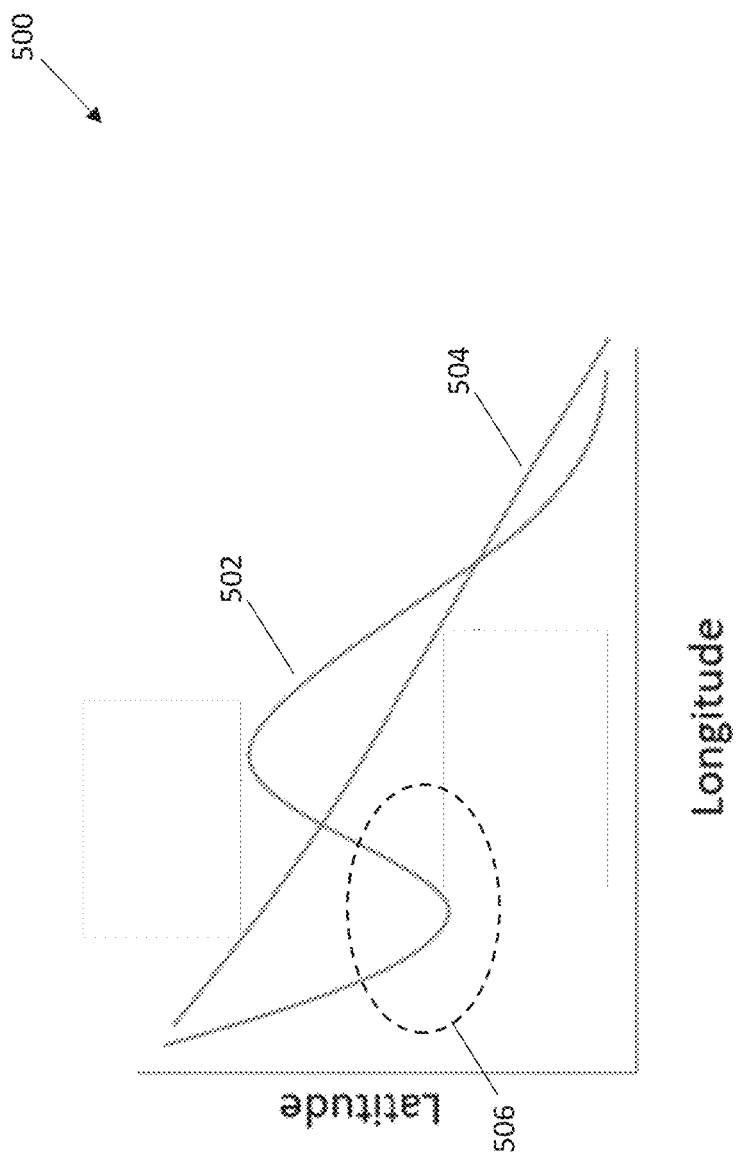
FIG. 5 illustrates an exemplary comparison of vectors produced by two separate trajectory files according to examples of the disclosure.

Even in examples where the cross track error appears significant, differences in aircraft speed, altitude, engine power, etc., may create the false appearance of significant cross track error even though two trajectories may actually be similar. FIG. 5 illustrates an exemplary comparison of vectors produced by two separate trajectory files according to examples of the disclosure. In one or more examples, the cross-track graph 500 can include a vector representation of a trajectory file associated with a first aircraft 502, and a vector representation of a trajectory file associated with a second aircraft 504. In one or more examples, and as shown in FIG. 5, the vector representation of both the first aircraft 502 and the second aircraft 504 can be represented in terms of the latitude and longitude found within the trajectory files associated with each aircraft. In one or more examples, comparing each row of the trajectory file associated with the first aircraft with the its corresponding row in the second aircraft's trajectory file may lead to the conclusion that the two files diverge significantly. For instance, the region of the first aircraft's 502 trajectory file highlighted at 506 when compared against the corresponding portion of the trajectory file of the second aircraft 504 may lead to a conclusion that the two procedures significantly diverge from one another. However, if the entirety of the trajectory files are viewed (as illustrated in FIG. 5), it can be seen that the two trajectory files are converging on one another in a non-monotonic fashion.

To further illustrate how a row-by-row comparison of trajectory files can lead to incorrect conclusions, consider the following example. To determine a difference between two paths/trajectories, one can employ a method that is analogous to holding a stick/measuring tape. A first person can walk down the trajectory of the first aircraft 502 and second person can walk down the trajectory of the second aircraft 504. During this walk each person a holds a respective end of a stick that can stretch or expand as the people converge or diverge. The two people can keep track of how long the stick gets, with the maximum distance between the two points being used to determine the divergence of the two trajectories. However, this method may lead to false positives in which the farthest divergence between the two trajectories is assumed to be representative of the divergence between the two trajectories.

Figure 6:
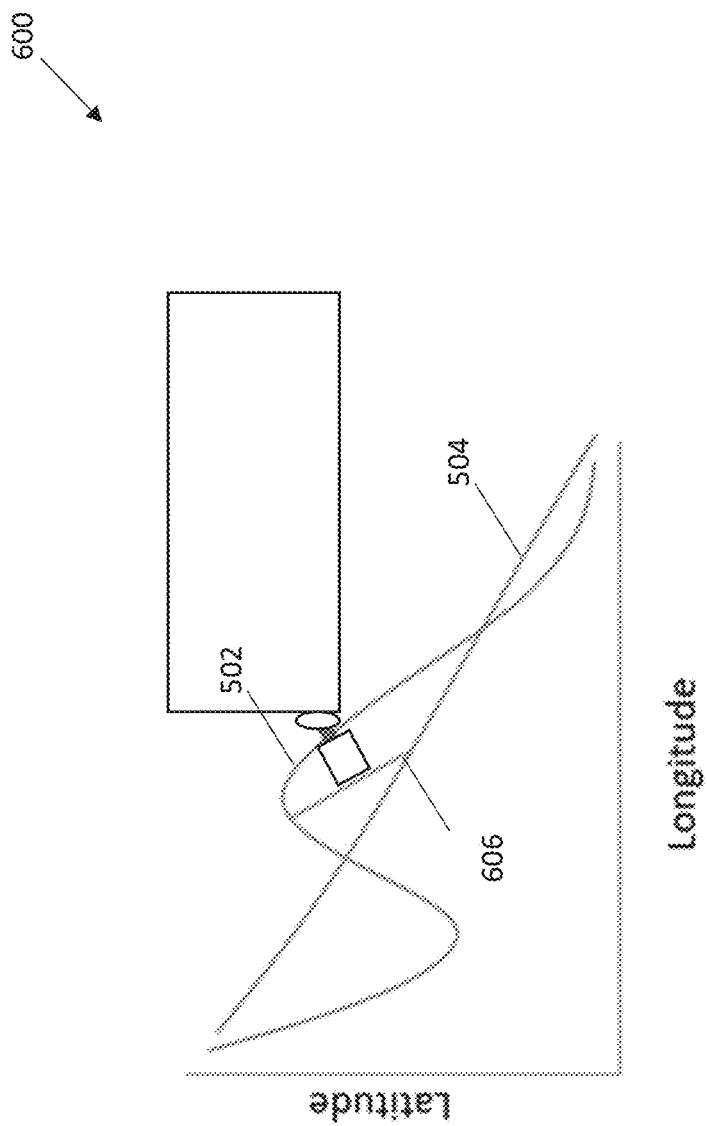
FIG. 6 illustrates an exemplary distance measurement between two vectors produced by two separate trajectory files according to examples of the disclosure.

FIG. 6 illustrates an exemplary distance measurement between two vectors produced by two separate trajectory files according to examples of the disclosure. The example 600 of FIG. 6 illustrates the same trajectories 502 and 504 as described above with respect to FIG. 5, but also includes a measurement 606 that represents the longest distance between the trajectories 502 and 504 that represent a first and second aircraft respectively. The example 600 of FIG. 6 can illustrate the outcome of the comparison process described above. By measuring the maximum or longest distance between the trajectories 502 and 504, an erroneous conclusion can result because the maximum distance may not take into account that the two trajectories are converging in a non-monotonic manner. Doing a time comparison (i.e., row-by-row) of the trajectory files associated with each translated procedure, as shown above, can lead to inaccurate conclusions regarding the translation of procedures to instructions for flight management computer. As described above, the row-by-row comparison may be inaccurate because it may not take into account differences in air speed, altitude, and other factors that might make the row-by-row comparison inaccurate, but would not necessarily affect the overall differences between the trajectories.

In one or more examples, in order to compare trajectories, a comparison method can be used that ignores time relationships between the two trajectories files as a basis for comparison, and instead compares them in a manner that will accurately indicate if the two trajectories diverge to such a degree that it is indicative of a translation error in one or both of the files. As will be described in further detail below, because a simulation file produces large amounts of data, the comparison method described below can be especially suited to operating in a computing environment in that the method can be structured and configured in a manner that makes the automated comparison of trajectory files efficient from a computer resources perspective.

Figure 7:
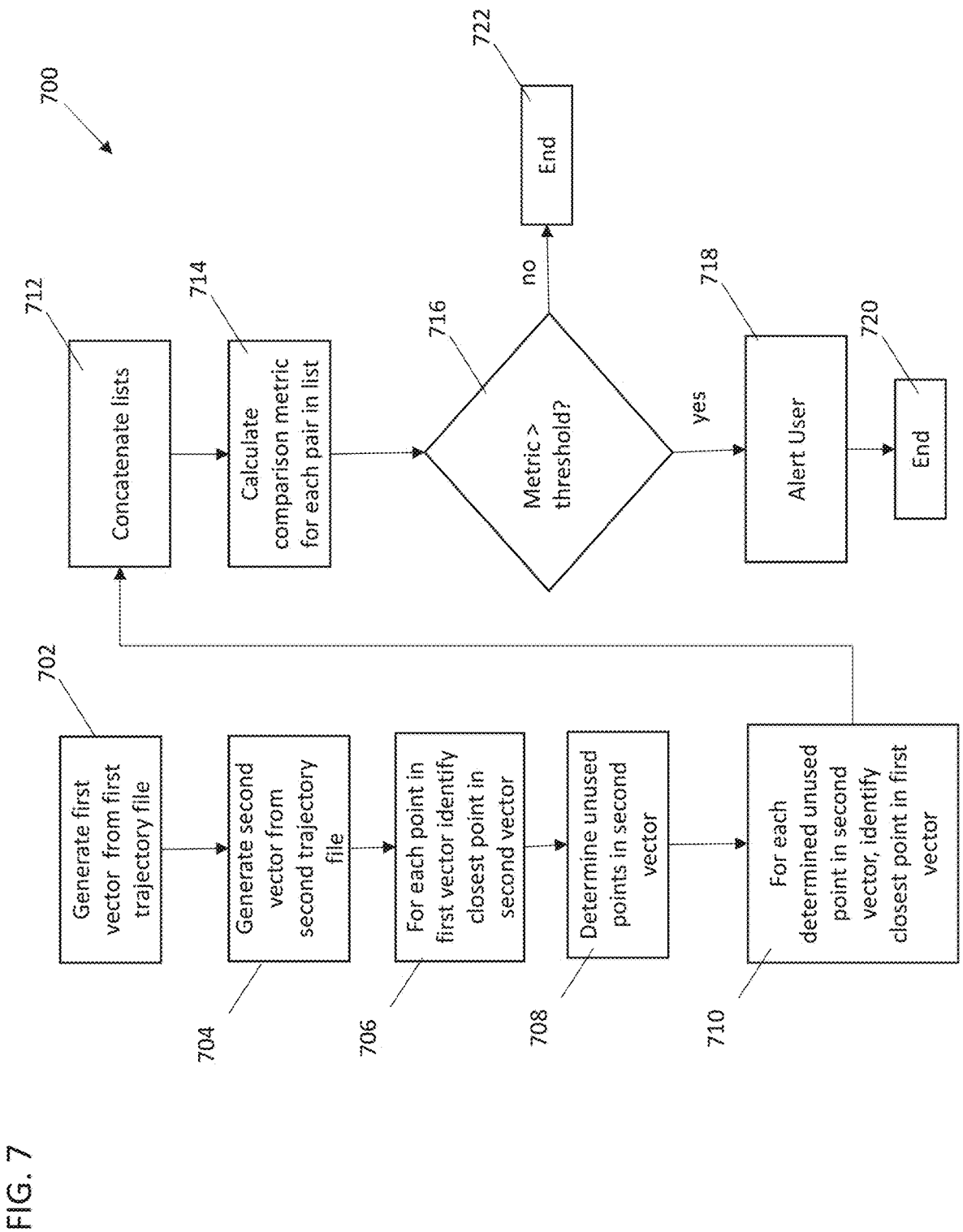
FIG. 7 illustrates an exemplary trajectory file comparison procedure according to examples of the disclosure.

FIG. 7 illustrates an exemplary trajectory file comparison procedure according to examples of the disclosure. In one or more examples, the example procedure 700 of FIG. 7 can be implemented on a computing system that can ingest the large trajectory files created by one or more simulations of translated terminal area procedures (or other types of procedures) and generate a comparison metric that can be indicative of an error in either or both of the translation flight trajectories being compared. In one or more examples, the process 700 of FIG. 7 can begin at step 702 wherein a first vector is generated based on a first trajectory file. In one or more examples, the first trajectory file can represent the result of a simulation that simulates a flight based on a first set of instructions translated from a flight procedure published by a regulatory body such as the FAA. In one or more examples, a vector can represent any two or more dimensional representation of the data produced in a trajectory file. For instance in one or more examples, a vector can represent the latitude and longitude coordinates from each row of the trajectory file. However, the example above should not be seen as limiting and could be applied to any vector derived from the trajectory file and the vector can include any number of dimensions.

Once the first vector has been generated at step 702, the process 700 can move to step 704 wherein a second vector is generated. In one or more examples, the second vector can represent a vector from a simulation result of a second translation of the same procedure described above with respect to step 702. Thus, in one or more examples, the vector generated at step 704 can represent any two or more dimensional representation of the data produced in a trajectory file. For instance in one or more examples, a vector can represent the latitude and longitude coordinates from each row of the trajectory file. However, the example above should not be seen as limiting and could be applied to any vector derived from the trajectory file and the vector can include any number of dimensions.

Once the two vectors that are to be compared have been generated at steps 702 and 704, the process 700 can move to step 706 wherein for each point in the first vector (generated at step 702), the closest point in the second vector is determined. In one or more examples, the closest point in the second vector to a point in the first vector can be based on the Cartesian distance between the two vectors. Additionally or alternatively, the distance can be based on the Euclidean distance between the two vectors. In one or more examples, at step 706, the process 700 can generate a list that lists each point in the first vector and its closest point in the second vector. The corresponding closest point in the second vector to a point in the first vector can be referred to as a "matching" point. Thus, in one or more examples, and at step 706 a list can be generated that at each row lists a point in the first vector and lists its corresponding matching point in the second vector. In one or more examples, the list generated at step 706 can be as long as the number of points in the first vector, since at step 706 a matching point from the second vector is determine for each and every point in the first vector.

Referring back to the example of FIG. 5, it can be noted that certain points in the second vector may not get matched to a point in the first vector. For instance, at region 506 of FIG. 5, the points in vector 502 that diverge farthest away from vector 504, may never match to any of the points in vector 504 since they are the points that are the farthest away. Furthermore, some points in vector 502 may serve as a "match" for multiple points of vector 504. To ensure that the comparison process 700 of FIG. 7 considers the entirety of the data when determining if there is a significant divergence between the first and second vectors, in one or more examples, the process 700 can also keep track of which points of the second vector have been matched to a point in the first vector, and which points in the second vector have not been matched to any points in the first vector. In this way, the entirety of the data set can be considered when determining if two tracks diverge from one another.

Returning to the example of FIG. 7, once the closest point in the second vector has been determined for each point in the first vector at step 706, the process 700 can move to step 708 wherein points in the second vector that did not match to the first vector are identified. As described above, the points in the second vector that did not match to any points in the first vector may represent portions of the second vector that (from a distance standpoint) diverge the most from the first vector. Thus, at step 708, those points are identified so that the process 700 can ensure that they too are considered when comparing the trajectory files that generated both the first vector and the second vector.

Once the unused points in the second vector are identified at step 708, the process 700 can move to step 710 wherein for each determined unused point in the second vector, the closest point from the first vector is identified. Step 710 can be substantially similar to step 706 insofar as a list is generated in which each row of the list includes an unmatched point from the second vector and its corresponding matching point from the first vector. Thus at step 710, a second list is created that lists each and every unused second vector point from step 706 and its corresponding match from the first vector.

Once the second list is generated at step 710, the process 700 can move to step 712 wherein the lists are concatenated to form one list. Thus at step 712, the lists generated at steps 706 and 710 are combined into one list that includes a matching point for each and every point for each vector being compared. Using a list such as the one generated at step 712 can ensure that the comparison process 700 accounts for the fact that the two aircraft could have different speeds, different time stamps, and different altitudes and any given point in time and thus goes beyond comparing points in a vector by time which could lead to an erroneous conclusion that two vectors diverge when in fact they may actually converge and be insignificantly different.

Once the two lists are concatenated at step 712, the process 700 can move to step 714 wherein one or more comparison metrics are generated for each pair of matching points in the list generated at step 712. In one or more examples, the list generated at step 712 can not only include the latitude and longitude of each matching point, but can also include other flight attributes such as airspeed, ground track distance, and altitude for each matching point. Thus, in one or more examples, in order to generate one or more comparison metrics, the process 700 at step 712 can compare an attribute from a point in the first vector with the corresponding attribute from its matching point in the second vector (and vice versa). In one or more examples, comparing two attributes can include calculating the maximum values of the two attributes being compared, the average, and the standard deviation of the two attributes. In one or more examples, the output at step 714 can be in the form a spreadsheet or file that lists the metrics for each row of the list generated at step 712. These metrics, as described in further detail below, can be used to determine whether or not two trajectory files differ by a significant amount such that it is likely that one of the trajectory files has been generated using an erroneous translation of a terminal area procedure.

Figure 8:
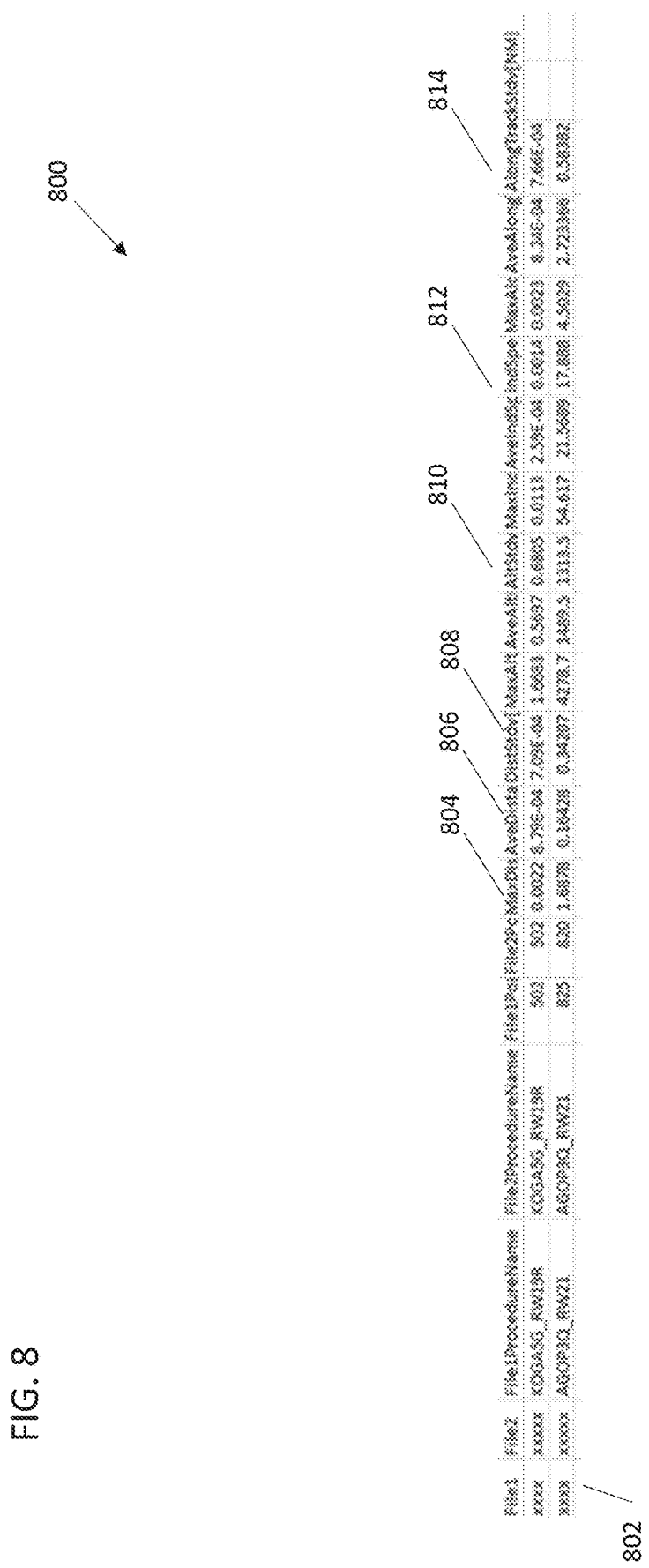
FIG. 8 illustrates an exemplary output comparison metric file according to examples of the disclosure.

FIG. 8 illustrates an exemplary output comparison metric file according to examples of the disclosure. In one or more examples, the file 800 can include multiple rows 802 corresponding to each entry of the list generated at step 712 of the process 700 described above with respect to FIG. 7. In one more examples, the comparison metric file 800 can include the maximum attribute, the average attribute, and the standard deviation of the attribute. Thus for instance, with respect to distance, at entry 804, the maximum distance between the two points can be recorded, the average distance can be recorded at 806, and the standard deviation of the distances can be recorded at 808. The same max, average, and standard deviation can be calculated for other attributes as well. For instance, the max, average, and standard deviation can be calculated for altitude as shown at 810, for speed as shown at 812, and for track distances as shown at 814.

Returning to the example of FIG. 7, once the calculation metric file has been generated at step 714, the process 700 can move to step 716, wherein a determination is made as to whether the metrics generated at step 714 are greater than a pre-determined threshold. In one or more examples, a pre-determined threshold can be determined empirically such that the threshold can be used to indicate whether or not the divergence between two vectors is significant enough to be indicative of a translation error in one of the flight management computer instructions under comparison. In one or more examples, if the comparison metric is found to not be greater than the threshold, then the process can move to step 722 wherein the process 700 is terminated. However, in one or more examples, if the metric is larger than the threshold, then the process 800 can move to step 718 wherein the user of the comparison process 700 is alerted to the potential error. Once the user has been alerted at step 718, the process 700 can move to step 722 wherein the process 700 is terminated.

The example process of 700 can thus provide a method for comparing two trajectory files in a manner that minimizes the limitations encountered when simply performing a time-based comparison of two trajectory files as described above. In one or more examples, if the comparison yields a very large difference (i.e., greater than a larger second threshold) this can indicate that the two procedures being compared are not from translations of the same procedure. In one or more examples, the comparison process 700 of FIG. 7 can also be used to determine systemic errors in translation procedures. For instance if multiple flight procedure comparisons yield a high degree of error, then the user can ascertain that there is a system error in the translation process. The process 700 of FIG. 7 can be repeated for multiple flight paths, such that each flight path in a set is compared with each and every other flight path in the same set.

Figure 9:
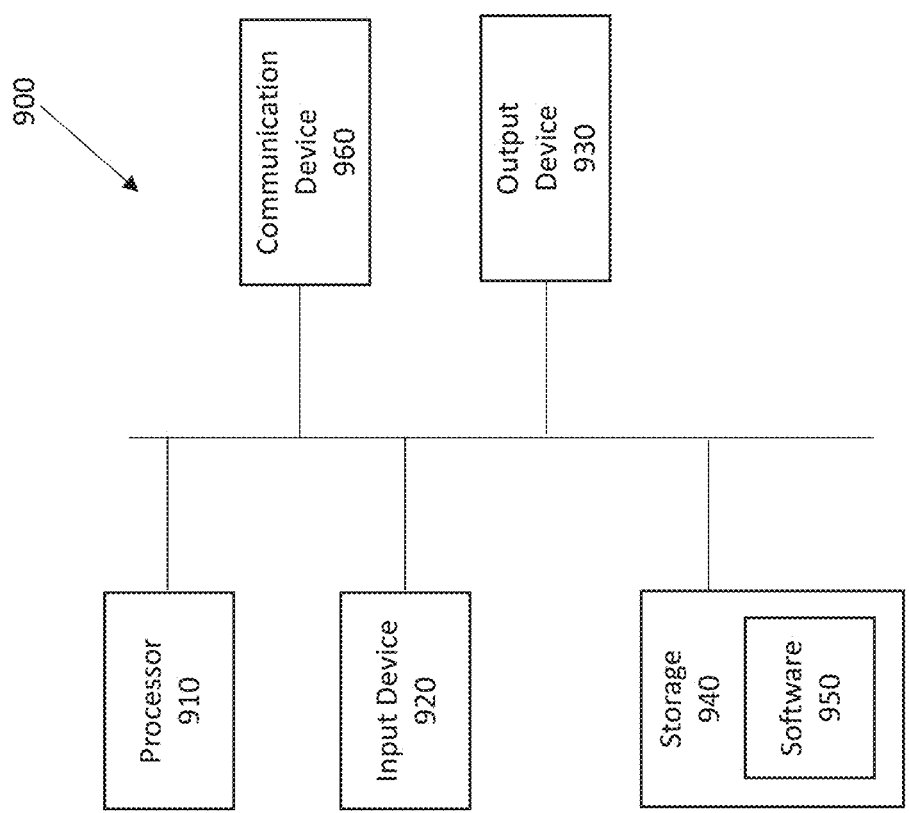
FIG. 9 illustrates an exemplary computing system, according to examples of the disclosure.

FIG. 9 illustrates an example of a computing system 900, in accordance one or more examples of the disclosure. System 900 can be a client or a server. As shown in FIG. 9, system 900 can be any suitable type of processor-based system, such as a personal computer, workstation, server, handheld computing device (portable electronic device) such as a phone or tablet, or dedicated device. The system 900 can include, for example, one or more of input device 920, output device 930, one or more processors 910, storage 940, and communication device 960. Input device 920 and output device 930 can generally correspond to those described above and can either be connectable or integrated with the computer.

Input device 920 can be any suitable device that provides input, such as a touch screen, keyboard or keypad, mouse, gesture recognition component of a virtual/augmented reality system, or voice-recognition device. Output device 930 can be or include any suitable device that provides output, such as a display, touch screen, haptics device, virtual/augmented reality display, or speaker.

Storage 940 can be any suitable device that provides storage, such as an electrical, magnetic, or optical memory including a RAM, cache, hard drive, removable storage disk, or other non-transitory computer readable medium. Communication device 960 can include any suitable device capable of transmitting and receiving signals over a network, such as a network interface chip or device. The components of the computing system 900 can be connected in any suitable manner, such as via a physical bus or wirelessly.

Processor(s) 910 can be any suitable processor or combination of processors, including any of, or any combination of, a central processing unit (CPU), field programmable gate array (FPGA), and application-specific integrated circuit (ASIC). Software 950, which can be stored in storage 940 and executed by one or more processors 910, can include, for example, the programming that embodies the functionality or portions of the functionality of the present disclosure (e.g., as embodied in the devices as described above). For example, software 950 can include one or more programs for performing one or more of the steps of method 400, method 800, and/or method 1000.

Software 950 can also be stored and/or transported within any non-transitory computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 940, that can contain or store programming for use by or in connection with an instruction execution system, apparatus, or device.

Software 950 can also be propagated within any transport medium for use by or in connection with an instruction execution system, apparatus, or device, such as those described above, that can fetch instructions associated with the software from the instruction execution system, apparatus, or device and execute the instructions. In the context of this disclosure, a transport medium can be any medium that can communicate, propagate or transport programming for use by or in connection with an instruction execution system, apparatus, or device. The transport computer readable medium can include, but is not limited to, an electronic, magnetic, optical, electromagnetic, or infrared wired or wireless propagation medium.

System 900 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, TI or T3 lines, cable networks, DSL, or telephone lines.

System 900 can implement any operating system suitable for operating on the network. Software 950 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated. For the purpose of clarity and a concise description, features are described herein as part of the same or separate embodiments; however, it will be appreciated that the scope of the disclosure includes embodiments having combinations of all or some of the features described.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims. Finally, the entire disclosure of the patents and publications referred to in this application are hereby incorporated herein by reference.

The invention claimed is:

1. A method for comparing flight management computer instructions for an airspace procedure, the method comprising:
   receiving a first translation of the airspace procedure, wherein the first translation comprises a first set of instructions for a flight management computer based on the airspace procedure;
   receiving a second translation of the airspace procedure, wherein the second translation comprises a second set of instructions for a flight management computer based on the airspace procedure;
   simulating the first translation on a computer-based simulator configured to simulate a response of an aircraft operating with a flight management computer operating on the first set of instructions of the first translation, wherein simulating the first translation comprises generating a first trajectory file, and wherein the first trajectory file includes a plurality of data points associated with one or more attributes of the simulated response;
   simulating the second translation on the computer-based simulator configured to simulate a response of an aircraft operating with a flight management computer operating on the second set of instructions of the second translation, wherein simulating the second translation comprises generating a second trajectory file, and wherein the second trajectory file includes a plurality of data points associated with one or more attributes of the simulated response;
   for each data point of the plurality of data points of the first trajectory file, determining a closest data point from the plurality of data points of the second trajectory file;
   determining which data points of the plurality of data points of the second trajectory file were not determined to be the closest data point with a data point of the plurality of data points of the first trajectory file;
   for each data point of the plurality of data points of the second trajectory file not determined to be the closest data point with a data point of the plurality of data points of the first trajectory file, determining a closest data point from the plurality of data points of the first trajectory file; and
   for each of the data points of the first and second trajectory files, generating one or more comparison metrics, wherein generating one or more comparison metrics comprises comparing the one or more attributes associated with the closest data points from the first and second trajectory files.

2. The method of claim 1, wherein the airspace procedure comprises a terminal area procedure for navigating an aircraft in an airspace associated with a runway of an airport.

3. The method of claim 1, wherein the first and second translations convert the airspace procedure into a Digital Aeronautical Flight Information File (DAFIF).

4. The method of claim 1, wherein the first and second translations convert the airspace procedure into an ARINC 424 file.

5. The method of claim 1, wherein the one or more attributes associated with the first and second trajectory files include latitude, longitude, air speed, altitude, and ground track distance.

6. The method of claim 1, wherein determining a closest data point from the plurality of data points of the second trajectory file comprises:
   for each data point of the second trajectory file, determining a distance between the data point of the first trajectory and the data point of the second trajectory file; and
   selecting the data point from the second trajectory file that has the shortest distance from the data point of the first trajectory.

7. The method of claim 6, wherein determining a distance between the data point of the first trajectory and the data point of the second trajectory file comprises measuring a Cartesian distance between the data point of the first trajectory and the data point of the second trajectory file.

8. The method of claim 1, wherein determining a closest data point from each data point of the plurality of data points of the second trajectory file not determined to be a closest data point with a data point of the plurality of data points of the first trajectory file from the plurality of data points of the second trajectory file comprises:
   for each data point of the first trajectory file, determining a distance between the data point of the second trajectory file and the data point of the first trajectory file; and
   selecting the data point from the second trajectory file that has the shortest distance from the data point of the first trajectory.

9. The method of claim 1, the method comprising:
   comparing the generated one or more comparison metrics with one or more pre-determined thresholds; and
   determining if one or both of the first translation and the second translation contain one or more errors based on the comparison between the one or more comparison metrics with the one or more pre-determined thresholds.

10. The method of claim 1, wherein the one or more comparison metrics are generated based on comparing the latitude, longitude, air speed, altitude, and ground track distance of data points being compared.

11. A system for comparing flight management computer instructions for an airspace procedure, the system comprising:

a memory;
one or more processors;
wherein the memory stores one or more programs that when executed by the one or more processors, cause the one or more processors to:
receive a first translation of the airspace procedure, wherein the first translation comprises a first set of instructions for a flight management computer based on the airspace procedure;
receive a second translation of the airspace procedure, wherein the second translation comprises a second set of instructions for a flight management computer based on the airspace procedure;
simulate the first translation on a computer-based simulator configured to simulate a response of an aircraft operating with a flight management computer operating on the first set of instructions of the first translation, wherein simulating the first translation comprises generating a first trajectory file, and wherein the first trajectory file includes a plurality of data points associated with one or more attributes of the simulated response;
simulate the second translation on the computer-based simulator configured to simulate a response of an aircraft operating with a flight management computer operating on the second set of instructions of the second translation, wherein simulating the second translation comprises generating a second trajectory file, and wherein the second trajectory file includes a plurality of data points associated with one or more attributes of the simulated response;
for each data point of the plurality of data points of the first trajectory file, determine a closest data point from the plurality of data points of the second trajectory file;
determine which data points of the plurality of data points of the second trajectory file were not determined to be the closest data point with a data point of the plurality of data points of the first trajectory file;
for each data point of the plurality of data points of the second trajectory file not determined to be the closest data point with a data point of the plurality of data points of the first trajectory file, determine a closest data point from the plurality of data points of the first trajectory file; and
for each of the data points of the first and second trajectory files, generate one or more comparison metrics, wherein generating one or more comparison metrics comprises comparing the one or more attributes associated with the closest data points from the first and second trajectory files.

12. The system of claim 11, wherein the airspace procedure comprises a terminal area procedure for navigating an aircraft in an airspace associated with a runway of an airport.

13. The system of claim 11, wherein the first and second translations convert the airspace procedure into a Digital Aeronautical Flight Information File (DAFIF).

14. The system of claim 11, wherein the first and second translations convert the airspace procedure into an ARINC 424 file.

15. The system of claim 11, wherein the one or more attributes associated with the first and second trajectory files include latitude, longitude, air speed, altitude, and ground track distance.

16. The system of claim 11, wherein determining a closest data point from the plurality of data points of the second trajectory file comprises:
for each data point of the second trajectory file, determining a distance between the data point of the first trajectory and the data point of the second trajectory file; and
selecting the data point from the second trajectory file that has the shortest distance from the data point of the first trajectory.

17. The system of claim 16, wherein determining a distance between the data point of the first trajectory and the data point of the second trajectory file comprises measuring a Cartesian distance between the data point of the first trajectory and the data point of the second trajectory file.

18. The system of claim 11, wherein determining a closest data point from each data point of the plurality of data points of the second trajectory file not determined to be a closest data point with a data point of the plurality of data points of the first trajectory file from the plurality of data points of the second trajectory file comprises:
for each data point of the first trajectory file, determining a distance between the data point of the second trajectory file and the data point of the first trajectory file; and
selecting the data point from the second trajectory file that has the shortest distance from the data point of the first trajectory.

19. The system of claim 11, wherein the processor is caused to:
compare the generated one or more comparison metrics with one or more pre-determined thresholds; and
determine if one or both of the first translation and the second translation contain one or more errors based on the comparison between the one or more comparison metrics with the one or more pre-determined thresholds.

20. The system of claim 11, wherein the one or more comparison metrics are generated based on comparing the latitude, longitude, air speed, altitude, and ground track distance of data points being compared.

21. A non-transitory computer readable storage medium storing one or more programs for comparing flight management computer instructions for an airspace procedure, for execution by one or more processors of an electronic device that when executed by the device, cause the device to:
receive a first translation of the airspace procedure, wherein the first translation comprises a first set of instructions for a flight management computer based on the airspace procedure;
receive a second translation of the airspace procedure, wherein the second translation comprises a second set of instructions for a flight management computer based on the airspace procedure;
simulate the first translation on a computer-based simulator configured to simulate a response of an aircraft operating with a flight management computer operating on the first set of instructions of the first translation, wherein simulating the first translation comprises generating a first trajectory file, and wherein the first trajectory file includes a plurality of data points associated with one or more attributes of the simulated response;
simulate the second translation on the computer-based simulator configured to simulate a response of an aircraft operating with a flight management computer operating on the second set of instructions of the second translation, wherein simulating the second translation comprises generating a second trajectory file, and wherein the second trajectory file includes a plurality of data points associated with one or more attributes of the simulated response;

for each data point of the plurality of data points of the first trajectory file, determine a closest data point from the plurality of data points of the second trajectory file;

determine which data points of the plurality of data points of the second trajectory file were not determined to be the closest data point with a data point of the plurality of data points of the first trajectory file;

for each data point of the plurality of data points of the second trajectory file not determined to be the closest data point with a data point of the plurality of data points of the first trajectory file, determine a closest data point from the plurality of data points of the first trajectory file; and for each of the data points of the first and second trajectory files, generate one or more comparison metrics, wherein generating one or more comparison metrics comprises comparing the one or more attributes associated with the closest data points from the first and second trajectory files.

22. The method of claim 1, wherein the airspace procedure comprises a terminal area procedure for navigating an aircraft in an airspace associated with a runway of an airport.

23. The non-transitory computer readable storage medium of claim 21, wherein the first and second translations convert the airspace procedure into a Digital Aeronautical Flight Information File (DAFIF).

24. The non-transitory computer readable storage medium of claim 21, wherein the first and second translations convert the airspace procedure into an ARINC 424 file.

25. The non-transitory computer readable storage medium of claim 21, wherein the one or more attributes associated with the first and second trajectory files include latitude, longitude, air speed, altitude, and ground track distance.

26. The non-transitory computer readable storage medium of claim 21, wherein determining a closest data point from the plurality of data points of the second trajectory file comprises:

for each data point of the second trajectory file, determining a distance between the data point of the first trajectory and the data point of the second trajectory file; and selecting the data point from the second trajectory file that has the shortest distance from the data point of the first trajectory.

27. The non-transitory computer readable storage medium of claim 26, wherein determining a distance between the data point of the first trajectory and the data point of the second trajectory file comprises measuring a Cartesian distance between the data point of the first trajectory and the data point of the second trajectory file.

28. The non-transitory computer readable storage medium of claim 21, wherein determining a closest data point from each data point of the plurality of data points of the second trajectory file not determined to be a closest data point with a data point of the plurality of data points of the first trajectory file from the plurality of data points of the second trajectory file comprises:

for each data point of the first trajectory file, determining a distance between the data point of the second trajectory file and the data point of the first trajectory file; and selecting the data point from the second trajectory file that has the shortest distance from the data point of the first trajectory.

29. The non-transitory computer readable storage medium of claim 21, the method caused to:

compare the generated one or more comparison metrics with one or more pre-determined thresholds; and determine if one or both of the first translation and the second translation contain one or more errors based on the comparison between the one or more comparison metrics with the one or more pre-determined thresholds.

30. The non-transitory computer readable storage medium of claim 21, wherein the one or more comparison metrics are generated based on comparing the latitude, longitude, air speed, altitude, and ground track distance of data points being compared.

31. The method of claim 1, comprising generating a first list that comprises each data point of the plurality of data points of the first trajectory file and the data point from the plurality of data points of the second trajectory file determined to be closest to the respective data point of the plurality of data points of the first trajectory file; and generating a second list that comprises each data point of the plurality of data points of the second trajectory file not in the first list and the data point from the plurality of data points of the first trajectory file determined to be closest to the data point of the plurality of data points of the second trajectory file.

32. The method of claim 31, comprising: concatenating the second list to the first list to generate a concatenated list.

* * * * *